(12) United States Patent
Manz et al.

(10) Patent No.: US 9,650,291 B2
(45) Date of Patent: May 16, 2017

(54) PANE WITH THERMAL RADIATION REFLECTING COATING

(71) Applicant: Saint-Gobain Glass France, Courbevoie (FR)

(72) Inventors: Florian Manz, Aachen (DE); Jan Hagen, Bonn (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 92 days.

(21) Appl. No.: 14/769,226

(22) PCT Filed: Dec. 19, 2013

(86) PCT No.: PCT/EP2013/077352
§ 371 (c)(1),
(2) Date: Aug. 20, 2015

(87) PCT Pub. No.: WO2014/127868
PCT Pub. Date: Aug. 28, 2014

(65) Prior Publication Data
US 2016/0002099 A1    Jan. 7, 2016

(30) Foreign Application Priority Data

Feb. 20, 2013  (EP) .................................... 13155970

(51) Int. Cl.
*B32B 17/06*    (2006.01)
*B05D 1/36*    (2006.01)
(Continued)

(52) U.S. Cl.
CPC .... *C03C 17/3435* (2013.01); *B32B 17/10036* (2013.01); *B32B 17/10174* (2013.01);
(Continued)

(58) Field of Classification Search
USPC ....... 428/426, 432, 688, 689, 699, 701, 702; 427/402
See application file for complete search history.

(56) References Cited

U.S. PATENT DOCUMENTS 6,068,914 A  *  5/2000  Boire ................ B32B 17/10018
                                                     359/360
6,447,921 B1 *  9/2002  Norimatsu .......... C03C 17/3417
                                                     428/34

(Continued)

FOREIGN PATENT DOCUMENTS

EP         0 536 607         4/1993
EP         2 141 135         1/2010
(Continued)

OTHER PUBLICATIONS

International Search Report Issued Feb. 3, 2014 in PCT/EP13/077352 Filed Dec. 19, 2013.

*Primary Examiner* — Lauren R Colgan
(74) *Attorney, Agent, or Firm* — Oblon, McClelland, Maier & Neustadt, L.L.P.

(57) ABSTRACT

The present invention relates to a pane with thermal radiation reflecting coating, comprising at least one substrate (1) and at least one thermal radiation reflecting coating (2) at least on the interior-side surface of the substrate (1), wherein the pane has transmittance in the visible spectral range of less than 5%, and the coating (2), proceeding from the substrate (1), comprises at least:
  one adhesive layer (3) that contains at least one material with a refractive index of less than 1.8,
  one functional layer (4) that contains at least one transparent, electrically conductive oxide,
  one optically high-refractive-index layer (5) that contains at least one material with a refractive index greater than or equal to 1.8, and
(Continued)

Figure 1:
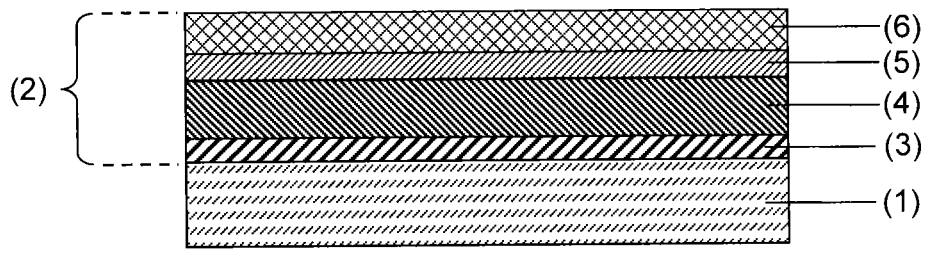

one optically low-refractive-index layer (6) that contains at least one material with a refractive index of less than 1.8.

15 Claims, 4 Drawing Sheets

(51) Int. Cl.
*C03C 17/34* (2006.01)
*G02B 1/113* (2015.01)
*G02B 1/115* (2015.01)
*G02B 5/20* (2006.01)
*G02B 5/26* (2006.01)
*B32B 17/10* (2006.01)
*C23C 14/00* (2006.01)
*C23C 14/06* (2006.01)
*C23C 14/08* (2006.01)
*C23C 14/18* (2006.01)
*C23C 14/35* (2006.01)

(52) U.S. Cl.
CPC .. *B32B 17/10431* (2013.01); *B32B 17/10761* (2013.01); *C03C 17/3417* (2013.01); *C03C 17/3482* (2013.01); *C23C 14/0036* (2013.01); *C23C 14/0641* (2013.01); *C23C 14/0652* (2013.01); *C23C 14/081* (2013.01); *C23C 14/083* (2013.01); *C23C 14/086* (2013.01); *C23C 14/185* (2013.01); *C23C 14/35* (2013.01); *G02B 1/113* (2013.01); *G02B 1/115* (2013.01); *G02B 5/208* (2013.01); *G02B 5/26* (2013.01); *B32B 2255/28* (2013.01); *B32B 2419/00* (2013.01); *B32B 2605/08* (2013.01); *B32B 2605/10* (2013.01); *B32B 2605/12* (2013.01); *B32B 2605/18* (2013.01); *C03C 2217/734* (2013.01); *C03C 2217/94* (2013.01); *C03C 2217/948* (2013.01)

(56) References Cited

U.S. PATENT DOCUMENTS

| | | | |
|---|---|---|---|
| 6,572,990 | B1 | 6/2003 | Oyama et al. |
| 6,910,729 | B2* | 6/2005 | Kraenzler ......... B32B 17/10036 296/146.15 |
| 6,924,037 | B1* | 8/2005 | Joret ................ B32B 17/10 428/432 |
| 2004/0028953 | A1* | 2/2004 | Kraemling ............ B32B 17/10 428/698 |
| 2006/0188730 | A1* | 8/2006 | Varanasi ............... A47F 3/0434 428/432 |
| 2007/0154724 | A1* | 7/2007 | Muromachi ...... B32B 17/10036 428/426 |
| 2008/0070045 | A1* | 3/2008 | Barton ............. B32B 17/10036 428/433 |
| 2009/0320824 | A1* | 12/2009 | Henn .................. C03C 17/3417 126/500 |
| 2010/0221461 | A1* | 9/2010 | Torr ........................ B32B 17/10 428/34 |
| 2011/0210656 | A1* | 9/2011 | Lemmer ............... E06B 3/6715 312/405 |
| 2013/0129945 | A1 | 5/2013 | Durandeau et al. |
| 2014/0087101 | A1* | 3/2014 | Tixhon ............... C03C 17/3417 428/34 |
| 2016/0002099 | A1* | 1/2016 | Manz ................. C03C 17/3417 428/212 |

FOREIGN PATENT DOCUMENTS

| | | |
|---|---|---|
| WO | 2006 043026 | 4/2006 |
| WO | 2011 105991 | 9/2011 |
| WO | 2012 022876 | 2/2012 |

* cited by examiner

PANE WITH THERMAL RADIATION REFLECTING COATING

The invention relates to a pane with thermal radiation reflecting coating, a method for its production, and its use.

The interior of a motor vehicle can heat up greatly in the summer with high ambient temperatures and intense direct sunlight. When the outside temperature is lower than the temperature in the vehicle interior, which occurs in particular in the winter, a cold pane acts as a heat sink, which is perceived as unpleasant by the occupants. High heating performance of the climate control system must also be provided to prevent excessive cooling of the interior through the motor vehicle windows.

Thermal radiation reflecting coatings (so-called "low-E coatings") are known. Such a coating reflects a significant part of sunlight, in particular in the infrared range, which, in the summer, results in reduced warming of the vehicle interior. Moreover, the coating reduces the emission of long-wave thermal radiation of a heated pane into the vehicle interior when the coating is applied on the surface of a pane facing the vehicle interior. Moreover, in the case of low outside temperatures in the winter, such a coating reduces the outward emission of heat from the interior into the external surroundings.

A large number of thermal radiation reflecting coatings are known to the person skilled in the art. Such coatings can contain functional layers made of niobium, tantalum, nickel, chromium, zirconium, or alloys thereof, as is disclosed, for example, in U.S. Pat. No. 7,592,068B2, U.S. Pat. No. 7,923,131B2, and WO2004076174A1. The coatings can also contain functional layers made of silver, as known, for example, from EP 877 006 B1, EP 1 047 644 B1, and EP 1 917 222 B1. Moreover, coatings with functional layers made of indium tin oxide are also known, for example, from EP2141135A1, WO2010115558A1, and WO2011105991A1.

For aesthetic or thermal reasons, it can be desirable for a motor vehicle window pane to have reduced light transmittance. This is frequently the case, for example, with rear side windows, rear windows, or roof panels. It is customary to use tinted glasses for such panes. However, heavily tinted glasses have the disadvantage of a high interior-side reflection level compared to the transmittance level. Whereas from the outside the lower transmittance ensures a desired increase in privacy, the optical impression for the vehicle occupants is degraded. The perception of the external environment is disrupted for the occupants, in particular when the interior-side reflection level is greater than the transmittance level. In addition, excessively strong reflections have a bothersome or irritating effect on the occupants. When the interior-side surface of the pane is provided with a thermal radiation reflecting coating, the reflection cannot be reduced in a simple manner by means of conventional antireflection coatings because the two coatings are usually not optically compatible with each other and, consequently, cannot simply be combined.

The object of the present invention consists in providing an improved pane with thermal radiation reflecting coating as well as a method for its production. The pane should have reduced interior-side reflection with low light transmittance.

The object of the present invention is accomplished according to the invention by a pane with thermal radiation reflecting coating according to claim 1. Preferred embodiments emerge from the subclaims.

The pane according to the invention with thermal radiation reflecting coating comprises at least one substrate and at least one thermal radiation reflecting coating at least on the interior-side surface of the substrate, wherein the pane has transmittance in the visible spectral range of less than 5% and wherein the coating comprises, proceeding from the substrate, at least

- an adhesive layer that contains at least one material with a refractive index of less than 1.8,
- a functional layer that contains at least one transparent, electrically conductive oxide (TCO),
- an optically high-refractive-index layer that contains at least one material with a refractive index greater than or equal to 1.8, and
- an optically low-refractive-index layer that contains at least one material with a refractive index of less than 1.8.

The pane according to the invention is provided, in an opening, for example, of a motor vehicle or a building, to separate the interior from the external environment. The surface that is intended to be turned toward the interior in the installed position of the pane is referred to, in the context of the invention, as the interior-side surface. The coating according to the invention is arranged, according to the invention, on the interior-side surface of the substrate. This is particularly advantageous with regard to the thermal comfort in the interior. The coating according to the invention can, in the case of high external temperatures and sunlight, particularly effectively at least partially reflect the thermal radiation radiated by the entire pane in the direction of the interior. In the case of low outside temperatures, the coating according to the invention can effectively reflect the thermal radiation radiated out of the interior and thus reduce the action of the cold pane as a heat sink.

The great advantage of the invention resides in the combination of a pane with very low light transmittance and the thermal radiation reflecting coating according to the invention. The low light transmittance of the pane is typically obtained by means of a tinted substrate and/or tinted layers bonded to the substrate (for example, another pane and a polymer film in a composite glass). Such a pane has per se a high interior-side reflection level. The pronounced reflection is frequently perceived, by individuals situated in the interior delimited by the pane, as bothersome or even irritating. This is particularly true when the interior-side reflection level is greater than the transmittance level, by which means the perception of the external environment is disrupted or prevented. It has surprisingly been shown that the coating according to the invention has, in addition to the thermal radiation reflecting action, a reflection reducing action. By means of the coating according to the invention, the interior-side reflection level is advantageously reduced and the ratio of the transmittance level to the interior-side reflection level is advantageously increased.

The thermal radiation reflecting coating according to the invention is a layer structure that comprises at least the following layers:

- the adhesive layer according to the invention,
- above the adhesive layer, the functional layer according to the invention,
- above the functional layer, the optically high-refractive-index layer according to the invention, and
- above the optically high-refractive-index layer, the optically low-refractive-index layer according to the invention.

When a first layer is arranged above a second layer, this means, in the context of the invention, that the first layer is arranged farther from the substrate than the second layer. When a first layer is arranged below a second layer, this means, in the context of the invention, that the second layer is arranged farther from the substrate than the first layer.

When a first layer is arranged above or below a second layer, this does not necessarily mean, in the context of the invention, that the first and the second layer are situated in direct contact with each other. One or a plurality of additional layers can be arranged between the first and the second layer, unless this is explicitly ruled out.

The uppermost layer of the coating is, in the context of the invention, that layer that is the greatest distance from the substrate. The lowest layer of the coating is, in the context of the invention, that layer that is the least distance from the substrate.

When a layer or another element contains at least one material, this includes, in the context of the invention, the case in which the layer is made of the material.

Oxides and nitrides can, in principle, be stoichiometric, substoichiometric, or supersubstoichiometric relative to the oxygen content or nitrogen content.

The values indicated for refractive indices are measured at a wavelength of 550 nm.

The interior-side emissivity of the pane according to the invention is preferably less than or equal to 35%, particularly preferably less than or equal to 25%, most particularly preferably less than or equal to 20%. Here, the term "interior-side emissivity" refers to the measurement that indicates how much thermal radiation the pane gives off into an interior space, for example, of a building or a motor vehicle, in the installed position compared to an ideal thermal emitter (a black body). In the context of the invention, "emissivity" means the normal emission level at 283 K according to the standard EN 12898.

The pane according to the invention preferably has transmittance in the visible spectral range of less than 4%, particularly preferably of less than 3%. With panes with such low transmittance, the interior-side reflection level is particularly advantageously reduced.

The ratio $T_L/R_L$ of the interior-side transmittance level $T_L$ in the visible spectral range to the interior-side reflection level $R_L$ in the visible spectral range is preferably greater than or equal to 0.6, particularly preferably greater than or equal to 0.8, most particularly preferably greater than or equal to 1, and, in particular, greater than or equal to 1.5. This is particularly advantageous with regard to a pleasant perception of the external environment by an observer in the interior.

The interior-side transmittance level describes, in this case, the fraction of the radiation that penetrates from the outside through the pane into the interior of the radiation in the visible spectral range impinging on the pane. The interior-side reflection level fraction of the radiation describes the fraction of the radiation that is reflected back into the interior of the radiation in the visible spectral range impinging on the pane from the interior.

The value of the pane according to the invention for the total energy input from sunlight is preferably less than 50%, particularly preferably less than 40%, most particularly preferably less than 30%, in particular less than 20%. This value is also known to the person skilled in the art as the TTS value ("total transmitted sun").

The sheet resistance of the coating according to the invention is preferably from 10 ohm/square to 50 ohm/square, particularly preferably from 15 ohm/square to 30 ohm/square.

In an advantageous embodiment of the invention, the pane according to the invention is a composite pane. The substrate is bonded to a cover pane via at least one thermoplastic intermediate layer. The cover pane is intended to face the outside environment in the installed position of the composite pane, whereas the substrate faces the interior. The coating according to the invention is arranged on the surface of the substrate facing away from the cover pane, which is the interior-side surface of the composite pane.

The substrate and, optionally, the cover pane preferably contain glass, particularly preferably flat glass, float glass, quartz glass, borosilicate glass, soda lime glass, or plastics, preferably rigid plastics, in particular polyethylene, polypropylene, polycarbonate, polymethyl methacrylate, polystyrene, polyamide, polyester, polyvinyl chloride, and/or mixtures thereof. The substrate and, optionally, the cover pane preferably have a thickness from 1.0 mm to 25 mm and particularly preferably from 1.4 mm to 4.9 mm.

When the pane according to the invention is a composite pane, the thermoplastic intermediate layer preferably contains thermoplastic plastics, for example, polyvinyl butyral (PVB), ethylene vinyl acetate (EVA), polyurethane (PU), polyethylene terephthalate (PET), or multiple layers thereof, preferably with thicknesses from 0.3 mm to 0.9 mm.

The pane has, according to the invention, transmittance in the visible spectral range of less than or equal to 5%. For this, the substrate is preferably tinted and/or colored appropriately. When the pane is a composite pane, the cover pane and/or the thermoplastic intermediate layer can alternatively or additionally also be colored and/or tinted. In the case of a composite pane, the substrate and the cover pane preferably have, in each case, transmittance in the visible spectral range of less than 35%, particularly preferably less than 30%. The thermoplastic intermediate layer preferably has transmittance from 20% to 80%, particularly preferably from 20% to 70%, most particularly preferably from 20% to 50%.

The functional layer has reflecting properties for thermal radiation, in particular infrared radiation, yet is largely transparent in the visible spectral range. According to the invention, the functional layer contains at least one transparent, electrically conductive oxide (TCO). The refractive index of the transparent, electrically conductive oxide is preferably from 1.7 to 2.3. The functional layer preferably contains at least fluorine-doped tin oxide ($SnO_2$:F), antimony-doped tin oxide ($SnO_2$:Sb), and/or indium tin oxide (ITO), particularly preferably indium tin oxide (ITO). Thus, particularly good results are obtained with regard to the emissivity and the bendability of the coating according to the invention.

The indium tin oxide is preferably deposited using magnetically enhanced cathodic sputtering with a target made of indium tin oxide. The target preferably contains from 75 wt.-% to 95 wt.-% indium oxide and from 5 wt.-% to 25 wt.-% tin oxide as well as production-related admixtures. The deposition of the indium tin oxide is preferably done under a protective gas atmosphere, for example, argon. A small amount of oxygen can also be added to the protective gas, for example, to improve the homogeneity of the functional layer.

Alternatively, the target can preferably contain at least from 75 wt.-% to 95 wt.-% indium and from 5 wt.-% to 25 wt.-% tin. The deposition of the indium tin oxide is then done preferably under the addition of oxygen as reaction gas during the cathodic sputtering.

However, the functional layer can also include other transparent, electrically conductive oxides, for example, mixed indium/zinc oxide (IZO), gallium-doped or aluminum-doped zinc oxide, niobium-doped titanium oxide, cadmium stannate, and/or zinc stannate.

The thickness of the functional layer is preferably from 50 nm to 150 nm, particularly preferably from 60 nm to 140 nm, and most particularly preferably from 70 nm to 130 nm. In this range for the thickness of the functional layer, on the one hand, advantageous antireflecting action is obtained and, on the other, low emissivity.

The optically high-refractive-index layer effects in particular an adjustment of the reflection color of the pane according to the invention. Moreover, by means of the optically high-refractive-index layer, the stability as well as the corrosion and oxidation resistance of the functional layer can be improved. This is particularly advantageous when the pane provided with the coating is to be subjected to a temperature treatment, a bending process, and/or a prestressing process.

The refractive index of the material of the optically high-refractive-index layer is preferably from 1.7 to 2.3 and is particularly preferably greater than or equal to the refractive index of the material of the functional layer. Thus, advantageous optical properties of the coating are achieved, in particular an aesthetic color impression.

The optically high-refractive-index layer preferably contains at least one oxide or nitride, particularly preferably tungsten oxide, niobium oxide, tantalum oxide, zirconium oxide, hafnium oxide, bismuth oxide, titanium oxide, silicon nitride, zirconium nitride, hafnium nitride, and/or aluminum nitride. The optically high-refractive-index layer particularly preferably contains silicon nitride ($Si_3N_4$). Thus, particularly good results are obtained with regard to the stability of the coating and the optical properties. The silicon nitride can have dopants, for example, titanium, zirconium, boron, hafnium, and/or aluminum. The silicon nitride is most particularly preferably doped with aluminum ($Si_3N_4$:Al) or doped with zirconium ($Si_3N_4$:Zr) or doped with boron ($Si_3N_4$:B). This is particularly advantageous with regard to the optical properties and the emissivity of the coating as well as the speed of the application of the optically high-refractive-index layer, for example, by cathodic sputtering.

The silicon nitride is preferably deposited using magnetically enhanced cathodic sputtering with a target that contains at least silicon. The target for the deposition of a layer containing aluminum-doped silicon nitride preferably contains from 80 wt.-% to 95 wt.-% silicon and from 5 wt.-% to 20 wt.-% aluminum as well as production-related admixtures. The target for the deposition of a layer containing boron-doped silicon nitride preferably contains from 99.9990 wt.-% to 99.9999 wt.-% silicon and from 0.0001 wt.-% to 0.001 wt.-% boron as well as production-related admixtures. The target for the deposition of a layer containing zirconium-doped silicon nitride preferably contains from 60 wt.-% to 90 wt.-% silicon and from 10 wt.-% to 40 wt.-% zirconium as well as production-related admixtures. The deposition of the silicon nitride is preferably done under addition of nitrogen as reaction gas during the cathodic sputtering.

The thickness of the optically high-refractive-index layer is preferably less than 20 nm, particularly preferably less than 12 nm, most particularly preferably less than 10 nm and, in particular, less than 8 nm. The thickness of the optically high-refractive-index layer should be at least 1 nm, preferably at least 2 nm. In this range for the thickness of the optically high-refractive-index layer, particularly advantageous antireflecting properties of the coating according to the invention are obtained. The thickness is preferably from 1 nm to 20 nm, particularly preferably from 2 nm to 12 nm, most particularly preferably from 2 nm to 10 nm, and, in particular, from 2 nm to 8 nm.

During a temperature treatment after the application of the coating according to the invention, the silicon nitride can be partially oxidized. A layer deposited as $Si_3N_4$ then contains, after the temperature treatment, $Si_xN_yO_z$, with the oxygen content typically from 0 atomic-% to 35 atomic-%.

The adhesive layer results in a durably stable adhesion of the layers deposited above the adhesive layer on the substrate. The adhesive layer further prevents the accumulation of ions diffusing out of the substrate in the boundary area to the functional layer, in particular of sodium ions, if the substrate is made of glass. Such ions can lead to corrosion and to low adhesion of the functional layer. The adhesive layer is, consequently, particularly advantageous with regard to the stability of the functional layer.

The adhesive layer preferably contains at least one material with a refractive index between 1.5 and 1.8. The material of the adhesive layer preferably has a refractive index in the range of the refractive index of the substrate. The adhesive layer can contain, for example, at least one oxide and/or one nitride, preferably at least one oxide. The adhesive layer particularly preferably contains silicon dioxide ($SiO_2$). This is particularly advantageous with regard to the adhesion of the layers on the substrate deposited above the adhesive layer. The silicon dioxide can have dopants, for example, fluorine, carbon, nitrogen, boron, phosphorus, and/or aluminum. The silicon dioxide is most particularly preferably doped with aluminum ($SiO_2$:Al), doped with boron ($SiO_2$:B), or doped with zirconium ($SiO_2$:Zr). This is particularly advantageous with regard to the optical properties of the coating as well as the speed of the application of the adhesive layer, for example, by cathode sputtering.

The silicon dioxide is preferably deposited using magnetically enhanced cathodic sputtering with a target that contains at least silicon. The target for the deposition of an adhesive layer containing aluminum-doped silicon dioxide preferably contains from 80 wt.-% to 95 wt.-% silicon and from 5 wt.-% to 20 wt.-% aluminum as well as production-related admixtures. The target for the deposition of an adhesive layer containing boron-doped silicon dioxide preferably contains from 99.9990 wt.-% to 99.9999 wt.-% silicon and from 0.0001 wt.-% to 0.001 wt.-% boron as well as production-related admixtures. The target for the deposition of an adhesive layer containing zirconium-doped silicon dioxide preferably contains from 60 wt.-% to 90 wt.-% silicon and from 10 wt.-% to 40 wt.-% zirconium as well as production-related admixtures. The deposition of the silicon dioxide is preferably done under addition of oxygen as reaction gas during the cathodic sputtering.

The doping of the adhesive layer can also improve the smoothness of the layers applied above the adhesive layer. High smoothness of layers is particularly advantageous in the case of use of the pane according to the invention in the motor vehicle sector since, by this means, an unpleasant rough surface feel of the pane is avoided. When the pane according to the invention is a side window pane, it can be moved with low friction to the sealing lips.

However, alternatively, the adhesive layer can also contain, for example, aluminum oxide ($Al_2O_3$).

The adhesive layer preferably has a thickness from 10 nm to 150 nm, particularly preferably from 15 nm to 50 nm, for example, roughly 30 nm. This is particularly advantageous with regard to the adhesion of the coating according to the invention and the prevention of the diffusion of ions from the substrate into the functional layer.

An additional optically active layer, preferably with a thickness from 5 nm to 40 nm, can also be arranged below the adhesive layer. For example, the adhesive layer can contain SiO$_2$ and the additional optically active layer can contain at least one oxide, such as TiO$_2$, Al$_2$O$_3$, Ta$_2$O$_5$, Y$_2$O$_3$, ZnO, and/or ZnSnO$_x$, or one nitride, such as AlN or Si$_3$N$_4$. By means of the optically active layer, the antireflecting properties of the coating according to the invention are advantageously further improved. Moreover, the optically active layer enables improved adjustment of the color values in transmittance or reflection.

The optically low-refractive-index layer is critical for the antireflecting action of the coating according to the invention. Moreover, by means of the optically low-refractive-index layer, a neutral color impression of reflected and transmitted light is obtained and the corrosion resistance of the functional layer is improved.

The optically low-refractive-index layer can, for example, contain at least one oxide and/or one nitride. The optically low-refractive-index layer preferably contains at least one oxide, particularly preferably at least silicon oxide (SiO$_2$). This is particularly advantageous with regard to the optical properties of the pane and the corrosion resistance of the functional layer. The silicon dioxide can have dopants, for example, fluorine, carbon, nitrogen, boron, phosphorus, and/or aluminum. The silicon oxide is most particularly preferably doped with aluminum (SiO$_2$:Al), doped with boron (SiO$_2$:B), or doped with zirconium (SiO$_2$:Zr). Thus, particularly good results are obtained.

However, alternatively, the optically low-refractive-index layer can contain, for example, aluminum oxide (Al$_2$O$_3$).

The optically low-refractive-index layer preferably has a thickness from 40 nm to 130 nm, particularly preferably from 50 nm to 120 nm, most particularly preferably from 60 nm to 110 nm, and, in particular, from 70 nm to 100 nm. This is particularly advantageous with regard to low reflection and high transmittance of visible light as well as the setting of a selected color impression of the pane and the corrosion resistance of the functional layer. In this range for the thickness of the optically low-refractive-index layer, particularly advantageous antireflecting properties of the coating according to the invention are obtained.

In an advantageous embodiment of the invention, a cover layer is arranged above the optically high-refractive-index layer. The cover layer protects the coating according to the invention against damage, in particular against scratches. The cover layer preferably contains at least one oxide, particularly preferably at least TiO$_2$, ZrO$_2$, HfO$_2$, Nb$_2$O$_5$, Ta$_2$O$_5$, Cr$_2$O$_3$, WO$_3$ and/or CeO$_2$. The thickness of the cover layer is preferably from 2 nm to 50 nm, particularly preferably from 5 nm to 20 nm. Thus, particularly good results are achieved with regard to scratch resistance.

In an advantageous embodiment, no layer with a refractive index greater than the refractive index of the adhesive layer is arranged below the adhesive layer and no layer with a refractive index greater than the refractive index of the optically low-refractive-index layer is arranged above the optically low-refractive-index layer. This is particularly advantageous with regard to the optical properties of the pane and a simple layer structure.

The pane according to the invention can be flat or slightly or greatly curved in one or a plurality of spatial directions. Such curved panes occur, in particular, for glazings in the motor vehicle sector. Typical radii of curvature of the curved panes are in the range of roughly 10 cm to roughly 40 m. It has been demonstrated that the coating according to the invention is particularly well-suited to withstand a bending process without damage such as cracks.

The coating according to the invention can be applied on the surface of the substrate over its entire area. However, the surface of the substrate can also have coating-free regions. The surface of the substrate can, for example, have a circumferential coating-free edge region and/or a coating-free region that serves as a data transmission window or a communication window. In the coating-free region, the pane is permeable to electromagnetic and in particular to infrared radiation.

When the pane according to the invention is a composite pane, in an advantageous embodiment, a sun protection coating is applied on the surface of the substrate facing the cover pane, on the surface of the cover pane facing the substrate, or on a carrier film in the thermoplastic intermediate layer. The sun protection coating is advantageously protected there against corrosion and mechanical damage. The sun protection coating preferably comprises at least one metallic layer based on silver or a silver-containing alloy with a thickness from 5 nm to 25 nm. Particularly good results are obtained with two or three functional layers that are separated from each other by dielectric layers with thicknesses from 10 nm to 100 nm. The sun protection coating reflects fractions of the incident sunlight outside the visible spectral range, in particular in the infrared spectral range. By means of the sun protection coating, the heating up of the interior by direct sunlight is reduced. In addition, the sun protection coating reduces the heating of the elements of the composite pane arranged behind the sun protection coating and, thus, the thermal radiation emitted by the composite pane. Through the combination of the sun protection coating with the coating according to the invention for reflection of thermal radiation, the thermal comfort in the interior is advantageously further improved.

The invention further comprises a method for producing a pane according to the invention with thermal radiation reflecting coating, wherein at least (a) an adhesive layer (3) that contains at least one material with a refractive index of less than 1.8,
(b) a functional layer (4) that contains at least one transparent, electrically conductive oxide (TCO),
(c) an optically high-refractive-index layer (5) that contains at least one material with a refractive index greater than or equal to 1.8, and
(d) an optically low-refractive-index layer (6) that contains at least one material with a refractive index of less than 1.8, are applied in succession on the interior-side surface of a substrate.

The individual layers are deposited by methods known per se, preferably by magnetically enhanced cathodic sputtering. This is particularly advantageous with regard to simple, quick, economical, and uniform coating of the substrate. The cathodic sputtering is done in a protective gas atmosphere, for example, of argon, or in a reactive gas atmosphere, for example, by addition of oxygen or nitrogen.

However, the individual layers can also be applied by other methods known to the person skilled in the art, for example, by vapor deposition or chemical vapor deposition (CVD), by atomic layer deposition (ALD), by plasma-enhanced chemical vapor deposition (PECVD), or by wet chemical methods.

Preferably after the application of the thermal radiation reflecting coating, the pane is subjected to a temperature treatment. The substrate with the coating according to the invention is heated to a temperature of at least 200° C., particularly preferably at least 300° C. The crystallinity of the functional layer is, in particular, improved by the temperature treatment. In particular, the temperature treatment reduces the sheet resistance of the coating, which results in reduced emissivity and improved reflecting properties relative to thermal radiation. Moreover, the optical properties of the pane are significantly improved.

In an advantageous embodiment of the method according to the invention, the temperature treatment occurs within a bending process. The substrate with the coating according to the invention is bent, in the heated state, in one or a plurality of spatial directions. The temperature to which the substrate is heated is preferably from 500° C. to 700° C. It is a particular advantage of the coating for the reflection of thermal radiation according to the invention that it can be subjected to such a bending process without being damaged. The darkening layer according to the invention is not damaged during the bending process, for example, by cracks.

Of course, other temperature treatment steps can occur before or after the bending process. A temperature treatment can, alternatively, also be performed using laser radiation.

In an advantageous embodiment, after the temperature treatment and, optionally, after bending, the substrate can be provided with prestressing or partial prestressing. For this, the substrate is suitably cooled in a manner known per se. A prestressed substrate typically has surface compressive stresses of at least 69 MPa. A partially prestressed substrate typically has surface compressive stresses of 24 MPa to 52 MPa. A prestressed substrate is suitable as single pane safety glass, for example, as a side window or rear window of a motor vehicle.

In an advantageous embodiment of the invention, after the application of the coating, the substrate is bonded via at least one thermoplastic intermediate layer to a cover pane to form a composite pane. In principle, the substrate can also first be bonded to the cover pane and then provided with the coating.

The invention further includes the use of the pane according to the invention with thermal radiation reflecting coating in buildings, as a built-in component in furniture and devices, or in means of transportation for travel on land, in the air, or on water, in particular in trains, ships, and motor vehicles, for example, as a rear window, side window, and/or roof panel.

The invention is explained in detail in the following with reference to drawings and exemplary embodiments. The drawings are schematic representations and not true to scale. The drawings in no way restrict the invention.

Figure 2:
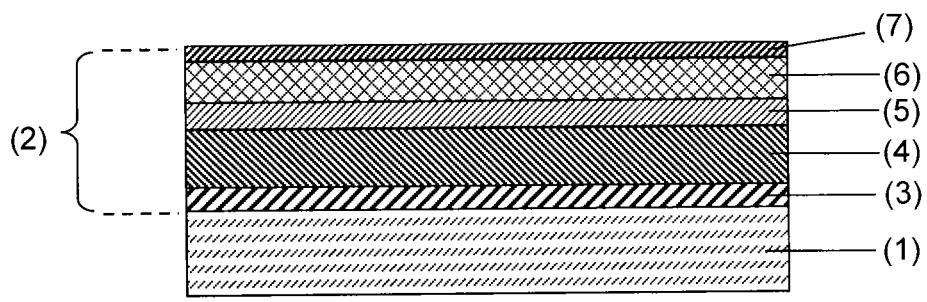
Figure 3:
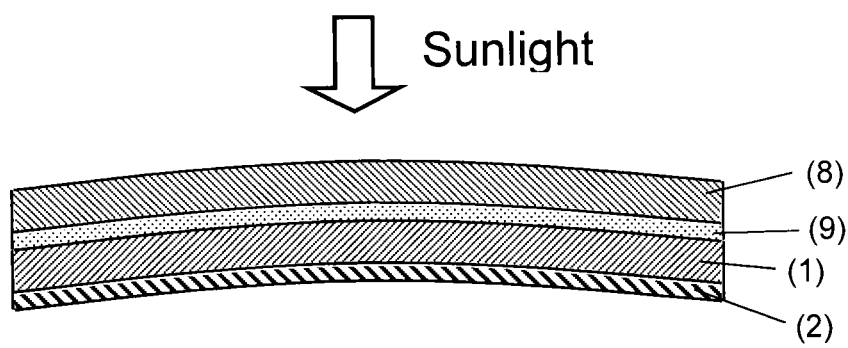
Figure 4:
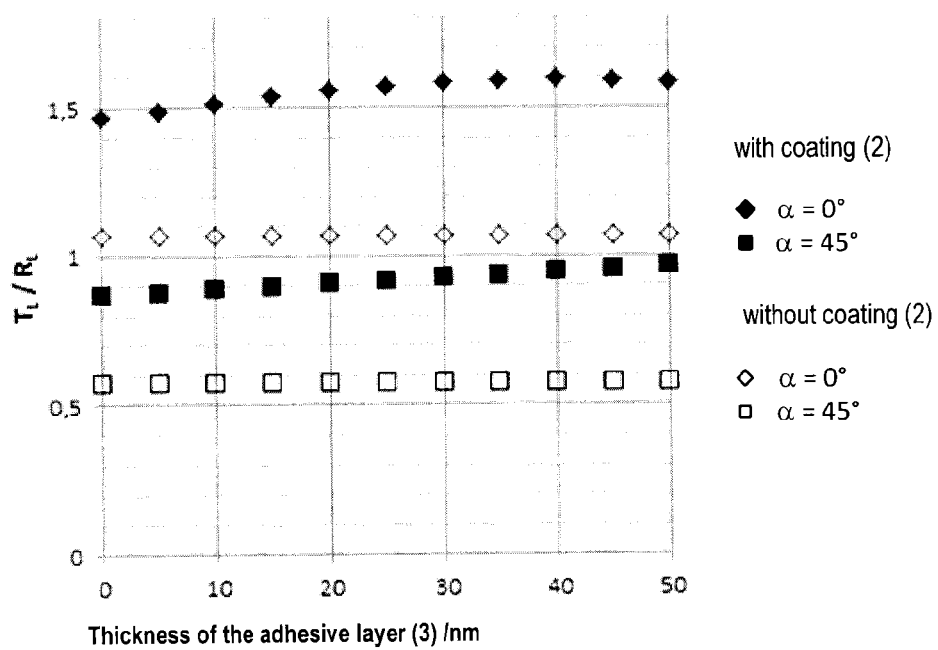
Figure 5:
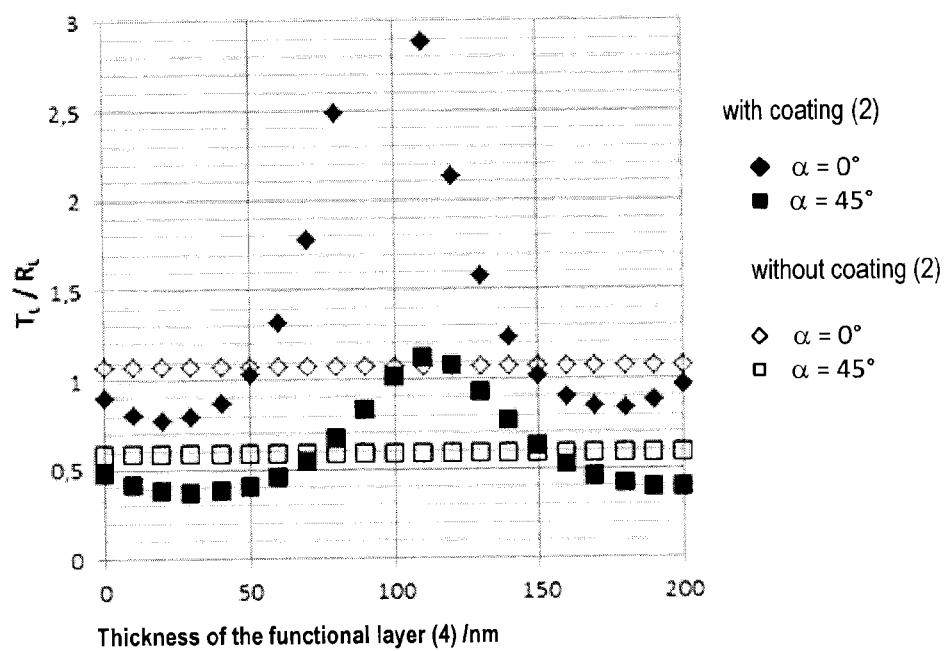
Figure 6:
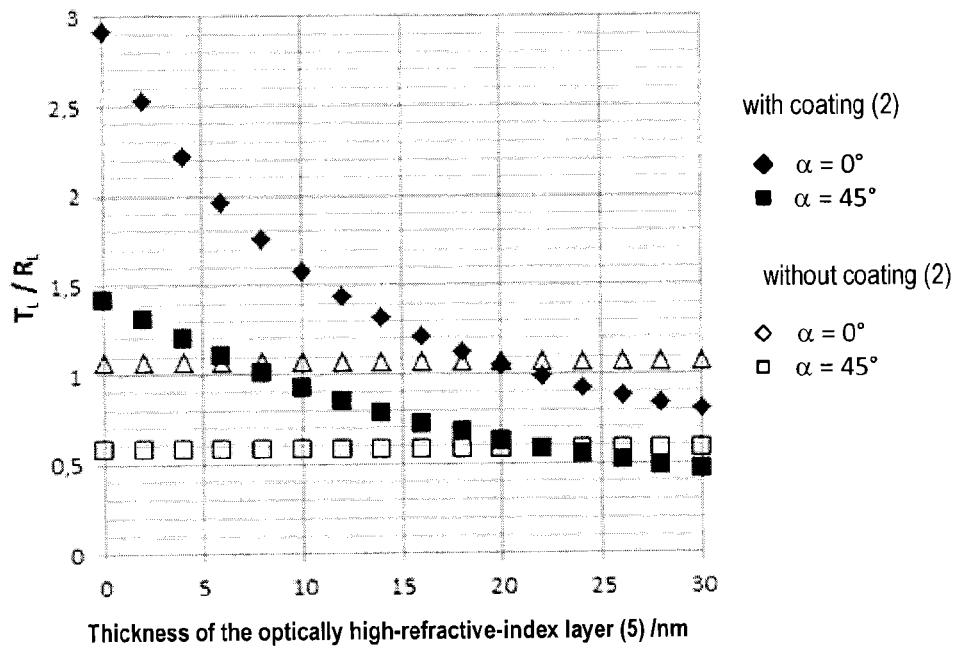
Figure 7:
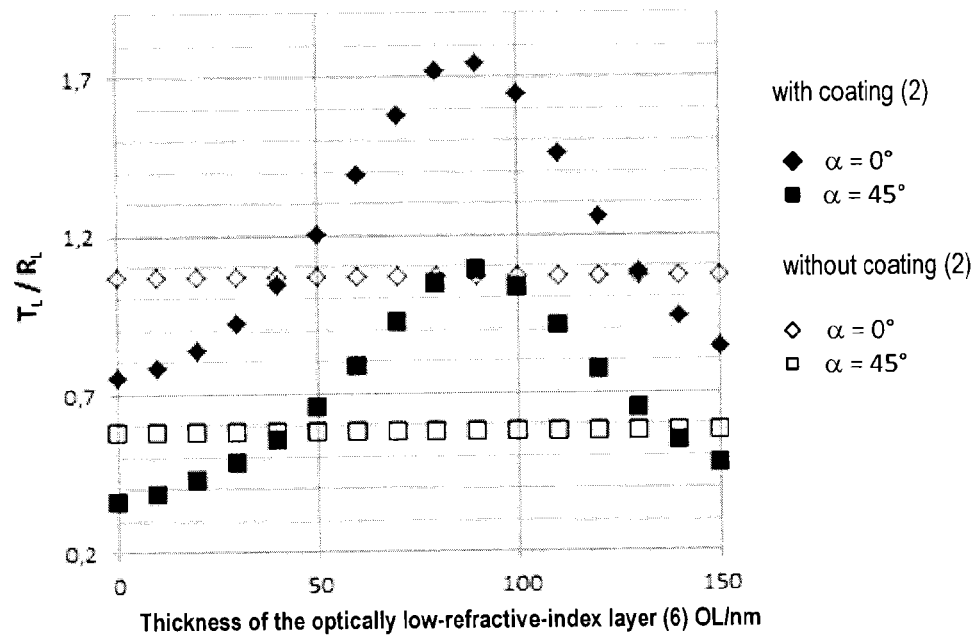
Figure 8:
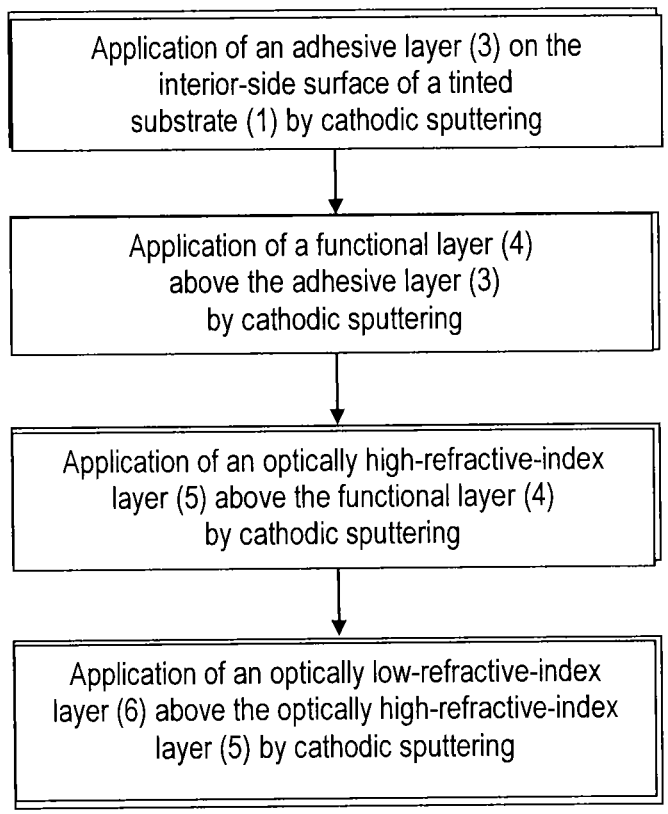

They depict:

FIG. 1 a cross-section through an embodiment of the pane according to the invention with thermal radiation reflecting coating, FIG. 2 a cross-section through another embodiment of the pane according to the invention with thermal radiation reflecting coating, FIG. 3 a cross-section through another embodiment of the pane according to the invention with thermal radiation reflecting coating, FIG. 4 a diagram of the ratio $T_L/R_L$ as a function of the thickness of the adhesive layer, FIG. 5 a diagram of the ratio $T_L/R_L$ as a function of the thickness of the functional layer, FIG. 6 a diagram of the ratio $T_L/R_L$ as a function of the thickness of the optically high-refractive-index layer, FIG. 7 a diagram of the ratio $T_L/R_L$ as a function of the thickness of the optically low-refractive-index layer, and FIG. 8 a detailed flow chart of an embodiment of the method according to the invention.

FIG. 1 depicts a cross-section through an embodiment of the pane according to the invention with the substrate 1 and the thermal radiation reflecting coating 2. The substrate 1 contains, for example, tinted soda lime glass and has a thickness of 6 mm. The coating 2 comprises an adhesive layer 3, a functional layer 4, an optically high-refractive-index layer 5, and an optically low-refractive-index layer 6. The layers are arranged in the order indicated with increasing distance from the substrate 1.

The adhesive layer 3 is made, for example, from aluminum-doped silicon oxide and has a thickness of 30 nm. The functional layer 4 is made, for example, from indium tin oxide (ITO) and has a thickness of 130 nm. The optically high-refractive-index layer 5 is made, for example, from aluminum-doped silicon nitride and has a thickness of 5 nm. The optically low-refractive-index layer 6 is made, for example, from aluminum-doped silicon oxide and has a thickness of 70 nm auf.

The individual layers of the coating 2 were deposited using magnetically enhanced cathodic sputtering. The target for the deposition of the adhesive layer 3 and the optically low-refractive-index layer 6 contained 92 wt.-% silicon and 8 wt.-% aluminum. The deposition was done under addition of oxygen as reaction gas during the cathodic sputtering. The target for the deposition of the functional layer 4 contained 90 wt.-% indium oxide and 10 wt.-% tin oxide. The deposition was done under an argon protective gas atmosphere with an oxygen fraction of less than 1%. The target for the deposition of the optically high-refractive-index layer 5 contained 92 wt.-% silicon and 8 wt.-% aluminum. The deposition was done under addition of nitrogen as reaction gas during the cathodic sputtering.

FIG. 2 depicts a cross-section through another embodiment of the pane according to the invention with the substrate 1 and the thermal radiation reflecting coating 2. The coating 2 is configured as in FIG. 1 with the adhesive layer 3, the functional layer 4, the optically high-refractive-index layer 5, and the optically low-refractive-index layer 6. A cover layer 7 is arranged above the coating 2. The cover layer contains $TiO_2$ and has a thickness of 10 nm. By means of the cover layer, the coating 2 is advantageously protected against mechanical damage, in particular against scratches.

FIG. 3 depicts a cross-section through a pane according to the invention with thermal radiation reflecting coating 2 as a composite pane. The substrate 1 is bonded to a cover pane 8 via a thermoplastic intermediate layer 9. The composite pane is intended as a roof panel for a motor vehicle. The composite pane is curved as is customary for panes in the automotive sector. In the installed position of the composite pane, the cover pane 8 faces the outside environment and the substrate 1 faces the vehicle interior. The interior-side surface of the substrate 1, which faces away from the cover pane 8 and the thermoplastic intermediate layer 9, is provided with the coating 2 according to the invention. The substrate 1 and the cover pane 8 are made of soda lime glass and have, in each case, a thickness of 2.1 mm. The thermoplastic intermediate layer 9 contains tinted polyvinyl butyral (PVB) and has a thickness of 0.76 mm.

The substrate 1, the cover pane 8, and the thermoplastic intermediate layer 9 are tinted. The substrate 1 and the cover pane 9 have, for example, in each case, transmittance in the visible spectral range of 27%; the thermoplastic intermediate layer 8 has, for example, transmittance of 23%. The composite pane has, without the coating 2, interior-side transmittance $T_L$ in the visible spectral range of 2.3% and interior-side reflection $R_L$ of 4.4% auf. The ratio $T_L/R_L$ is 0.5, without the coating 2. The thermal radiation reflecting coating 2 according to the invention surprisingly improves not only the thermal comfort in the interior of the motor vehicle, but also acts as an antireflection coating. The interior-side reflection $R_L$ is reduced to 2.0% by the coating 2. The ratio $T_L/R_L$ is increased to 1.1 by the coating 2. As a result of the coating 2, individuals in the motor vehicle interior are able to better perceive the external environment and are less bothered by reflections.

FIG. 4, FIG. 5, FIG. 6, and FIG. 7 show results of simulations of the ratio $T_L/R_L$ of the transmittance level $T_L$ in the visible spectral range to the reflection level $R_L$ in the visible spectral range. The greater the ratio $T_L/R_L$, the less pronounced the bothersome interior-side reflections and the more pleasant the optical impression of the pane. FIG. 4 presents the ratio $T_L/R_L$ as a function of the thickness of the adhesive layer 3. FIG. 5 presents the ratio $T_L/R_L$ as a function of the thickness of the functional layer 4. FIG. 6 presents the ratio $T_L/R_L$ as a function of the thickness of the optically high-refractive-index layer 5. FIG. 7 presents the ratio $T_L/R_L$ as a function of the thickness of the optically low-refractive-index layer 6.

The simulations assume the basic layer structure, whose layer sequence is presented with materials and layer thicknesses in Table 1. In each case, one of the layer thicknesses was varied; the remaining layer thicknesses corresponded to the values in Table 1. The aggregate of substrate 1, thermoplastic intermediate layer 8, and cover glass 9 had, without the coating 2, transmittance $T_L$ of roughly 4.2%.

By way of comparison, the figures present the ratio $T_L/R_L$ without the coating 2. The values are indicated in each case for two different angles of observation α. The angle α is the angle between the direction of observation (connecting line between observer and pane) and the surface normal of the pane.

TABLE 1

| Reference Character | | Material | Thickness |
|---|---|---|---|
| 6 | 2 | SiO$_2$:Al | 70 nm |
| 5 | | Si$_3$N$_4$:Al | 10 nm |
| 4 | | ITO | 130 nm |
| 3 | | SiO$_2$:Al | 30 nm |
| 1 | | Glass | 2.1 mm |
| 8 | | PVB | 0.76 mm |
| 9 | | Glass | 3.15 mm |

The absolute values for the ratio $T_L/R_L$ depend on the transmittance through the pane. A lower transmittance with unchanged reflection results in a lower ratio $T_L/R_L$. This means that the same coating 2 on a pane with lower transmittance yields a lower ratio $T_L/R_L$ than on a pane with higher transmittance. The qualitative dependence of the ratio $T_L/R_L$ is, however, independent of the transmittance of the pane and can be found in the figures.

From FIG. 4, it is discernible that the ratio $T_L/R_L$ has no clear dependence on the thickness of the adhesive layer 3. The thickness of the adhesive layer 3 thus hardly influences the antireflecting properties of the coating 2. The thickness of the adhesive layer 3 can, consequently, be selected on the basis of the adhesion-promoting properties and the barrier action against diffusing ions. It has been demonstrated that particularly good results are obtained with an adhesive layer with a thickness from 10 nm to 150 nm, preferably from 15 nm to 50 nm.

From FIG. 5, it is discernible that the thickness of the functional layer 4 has a clear influence on the antireflecting properties of the coating 2 and, thus, on the ratio $T_L/R_L$. The maximum for the ratio $T_L/R_L$ is obtained at a thickness of roughly 100 nm. In order to improve the thermal radiation reflecting action, a thicker functional layer 4 can, however, be desirable. It has been demonstrated that for thicknesses of the functional layer 4 from 50 nm to 150 nm, preferably from 60 nm to 140 nm, particularly preferably from 70 nm to 130 nm, a good compromise between the ratio $T_L/R_L$ and the thermal radiation reflecting action is achieved.

From FIG. 6, it is discernible that the thickness of the optically high-refractive-index layer 5 has a clear influence on the antireflecting properties of the coating 2 and, thus, on the ratio $T_L/R_L$. The ratio $T_L/R_L$ becomes larger the thinner the optically high-refractive-index layer 5 is implemented. With a thickness of less than 20 nm, the ratio $T_L/R_L$ is larger than with the pane without coating 2. Particularly good results are obtained for a thickness of the optically high-refractive-index layer 5 of less than 12 nm, preferably of less than 10 nm, particularly preferably of less than 8 nm. However, for the optically high-refractive-index layer 5 to be able to effectively protect the functional layer 4 against corrosion and oxidation, it should have a thickness of at least 1 nm, preferably at least 2 nm.

From FIG. 7, it is discernible that the thickness of the optically low-refractive-index layer 6 has a clear influence on the antireflecting properties of the coating 2 and, thus, on the ratio $T_L/R_L$. With a thickness of roughly 40 nm to 130 nm, the ratio $T_L/R_L$ is greater than with the pane without coating 2. Particularly good results are obtained for a thickness of the optically low-refractive-index layer 6 from 50 nm to 120 nm, preferably from 60 nm to 110 nm, particularly preferably from 70 nm to 100 nm.

By means of the coating 2 according to the invention, not only a thermal radiation reflecting action is obtained, but also an antireflecting action. When the coating 2 is applied on the pane with low light transmittance, it reduces bothersome and irritating interior-side reflections. The antireflecting action is even more pronounced with oblique light incidence. These results were unexpected and surprising for the person skilled in the art.

FIG. 8 depicts a flowchart of an exemplary embodiment of the method according to the invention for producing a pane with thermal radiation reflecting coating 2.

LIST OF REFERENCE CHARACTERS (1) substrate
(2) thermal radiation reflecting coating
(3) adhesive layer
(4) functional layer
(5) optically high-refractive-index layer
(6) optically low-refractive-index layer
(7) cover layer
(8) cover pane
(9) thermoplastic intermediate layer

The invention claimed is:

1. An article comprising a pane comprising a thermal radiation reflecting coating that separates an interior of the article from an external environment,
   wherein the article is selected from the group consisting of a building, an apparatus for land transportation, an apparatus for air transportation, and an apparatus for water transportation,
   wherein the pane comprising at least one substrate and at least one thermal radiation reflecting coating situated at least on an interior-side surface of the substrate,
   wherein the pane has a transmittance in the visible spectral range of less than 5%; and
   wherein the coating, in order proceeding from the substrate, comprises at least one adhesive layer comprising at least one material with a refractive index of less than 1.8,
one functional layer comprising at least one transparent, electrically conductive oxide,
one optically high-refractive-index layer comprising at least one material with a refractive index greater than or equal to 1.8, and
one optically low-refractive-index layer comprising at least one material with a refractive index of less than 1.8.

2. The article of claim 1, wherein the pane is a composite pane, and wherein the substrate is bonded to a cover pane via at least one thermoplastic intermediate layer.

3. The article of claim 1, wherein the pane has transmittance in the visible spectral range of less than 4%.

4. The article of claim 1, wherein the adhesive layer of the pane comprises at least one oxide.

5. The article of claim 1, wherein the adhesive layer of the pane has a thickness from 10 nm to 150 nm.

6. The article of claim 1, wherein the functional layer of the pane comprises at least fluorine-doped tin oxide, antimony-doped tin oxide, indium tin oxide, or a mixture thereof.

7. The article of claim 1, wherein the functional layer of the pane has a thickness from 50 nm to 150 nm.

8. The article of claim 1, wherein the optically high-refractive-index layer of the pane comprises at least one oxide or nitride.

9. The article of claim 1, wherein the optically high-refractive-index layer of the pane has a thickness of at least 1 nm and of less than 20 nm.

10. The article of claim 1, wherein the optically low-refractive-index layer of the pane comprises at least one oxide.

11. The article of claim 1, wherein the optically low-refractive-index layer of the pane has a thickness from 40 nm to 130 nm.

12. The article of claim 1, wherein a cover layer comprising at least one oxide is arranged above the optically low-refractive-index layer of the pane.

13. The article of claim 1, wherein a ratio of an interior-side transmittance level $T_L$ in the visible spectral range to an interior-side reflection level $R_L$ in the visible spectral range, $T_L/R_L$, of the pane is greater than or equal to 0.6.

14. The article of claim 1, which is a rear window, side window, and/or roof panel of a train, ship, or motor vehicle.

15. A method for producing the article of claim 1, the method comprising applying at least
    (a) the adhesive layer,
    (b) the functional layer,
    (c) the optically high-refractive-index layer, and
    (d) the optically low-refractive-index layer
in succession on the interior-side surface of the substrate, to form the pane; and
    inserting the pane in an opening of the article.

* * * * *